(12) United States Patent
Yamazaki et al.

(10) Patent No.: US 9,899,385 B2
(45) Date of Patent: Feb. 20, 2018

(54) SEMICONDUCTOR INTEGRATED CIRCUIT AND MANUFACTURING METHOD THEREOF

(75) Inventors: Takashi Yamazaki, Kanagawa (JP); Shimpei Tsujikawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 502 days.

(21) Appl. No.: 13/480,956

(22) Filed: May 25, 2012

(65) Prior Publication Data

US 2012/0307410 A1 Dec. 6, 2012

(30) Foreign Application Priority Data

Jun. 3, 2011 (JP) ................................ 2011-125639

(51) Int. Cl.
| | |
|---|---|
| H01L 29/66 | (2006.01) |
| H01L 27/092 | (2006.01) |
| H01L 21/8238 | (2006.01) |
| H01L 27/02 | (2006.01) |

(52) U.S. Cl.
CPC .. *H01L 27/0922* (2013.01); *H01L 21/823842* (2013.01); *H01L 27/0285* (2013.01); *H01L 27/0266* (2013.01)

(58) Field of Classification Search
CPC ............. H01L 27/0266; H01L 27/0285; H01L 21/823842
USPC ........................................................ 257/173
See application file for complete search history.

(56) References Cited

U.S. PATENT DOCUMENTS

| | | | | |
|---|---|---|---|---|
| 5,536,959 | A | * | 7/1996 | Kellam .......................... 257/327 |
| 6,037,200 | A | * | 3/2000 | Uda .................. H01L 21/28581 |
| | | | | 257/E21.173 |
| 2002/0146878 | A1* | | 10/2002 | Ohnakado et al. ........... 438/215 |
| 2004/0125521 | A1* | | 7/2004 | Sailing ................ H01L 27/0285 |
| | | | | 361/56 |

(Continued)

FOREIGN PATENT DOCUMENTS

JP 2006-121007 5/2006

OTHER PUBLICATIONS

Cynthia A. Torres et al.; Modular, Portable, and Easily Simulated ESD Protection Networks for Advanced CMOS Technologies; Electrical Overstress/Electrostatic Discharge Symposium, Sep. 11-13; Symposium Proceedings, pp. 81-94.

*Primary Examiner* — Kimberly Rizkallah
*Assistant Examiner* — Maria Ligai
(74) *Attorney, Agent, or Firm* — Dentons US LLP

(57) ABSTRACT

A semiconductor integrated circuit includes a protected circuit connected to two power supply lines that provide a supply voltage, a detecting circuit that includes a resistive element and a capacitive element connected in series between two power supply lines and detects a surge generated in the power supply line based on potential variation of an inter-element connecting node, and a protection transistor that is connected between two power supply lines and has a control electrode connected to an output of the detecting circuit. The protection transistor has the control electrode formed from a different electrode material having a work function difference from a transistor of the same channel conductivity type in the protected circuit, to have a different threshold voltage from the transistor so that the amount of leakage current per unit channel width may be smaller compared with the transistor.

12 Claims, 9 Drawing Sheets

(56) References Cited

U.S. PATENT DOCUMENTS

| | | | |
|---|---|---|---|
| 2006/0022274 A1* | 2/2006 | Hasegawa | H01L 27/0266 257/358 |
| 2006/0232318 A1* | 10/2006 | Iwahori et al. | 327/309 |
| 2007/0164323 A1* | 7/2007 | Forbes | H01L 21/28079 257/274 |
| 2007/0207575 A1* | 9/2007 | Taniguchi et al. | 438/199 |
| 2008/0067599 A1* | 3/2008 | Tsutsumi et al. | 257/358 |
| 2009/0039431 A1* | 2/2009 | Takasu | H01L 21/823412 257/360 |
| 2010/0246079 A1* | 9/2010 | Suzuki | H01L 27/0285 361/56 |

\* cited by examiner

F I G . 2
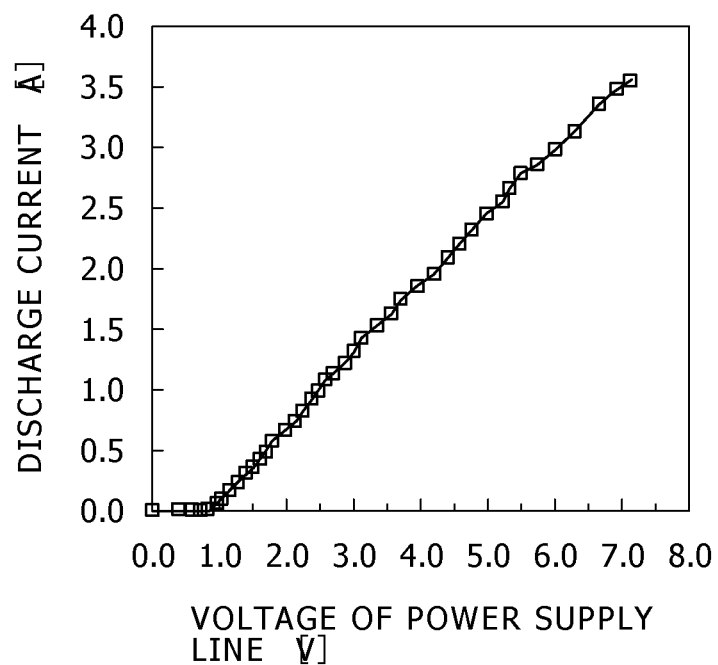

| | GATE LENGTH OF PROTECTION MOS Tr. | AMOUNT OF VARIATION IN LEAKAGE CURRENT OF ELECTROSTATIC PROTECTIVE CIRCUIT | CLAMP VOLTAGE OF ELECTROSTATIC PROTECTIVE CIRCUIT |
|---|---|---|---|
| RELATED ART | 0.4 | | 6.0 |
| FIRST EMBODIMENT | 0.3 | 1/17 | 5.3 |
| SECOND EMBODIMENT | 0.3 | 1/3027 | 5.4 |

SEMICONDUCTOR INTEGRATED CIRCUIT AND MANUFACTURING METHOD THEREOF

BACKGROUND

The technique of the present disclosure relates to a semiconductor integrated circuit in which a protected circuit and a protective circuit that removes a surge generated in a power supply line of the protected circuit are formed in the same semiconductor substrate, and a manufacturing method thereof.

In general, for the semiconductor integrated circuit such as a large scale integrated circuit (LSI), the importance of protecting a circuit having a predetermined function (hereinafter, referred to as internal circuit or protected circuit) from a surge generated in a power supply line of the internal circuit is increasing along with microminiaturization and voltage decrease of the semiconductor integrated circuit.

As a representative example of the surge generated in the power supply line, an ESD surge, which suddenly raises the power supply line potential due to an electrostatic discharge (ESD) to an external terminal of the power supply line, is known.

For the purpose of preventing the internal circuit from being broken down when a high voltage pulse is generated at the external terminal due to the ESD surge, an element or a circuit for ESD protection is integrated in the semiconductor substrate together with the internal circuit (protected circuit).

As the element or the circuit for ESD protection, e.g. one using a diode, one using a grounded-gate metal oxide semiconductor (GGMOS) obtained by short-circuiting of the gate and the source, or one using a thyristor is utilized as a related art.

Many internal circuits have a complementary metal oxide semiconductor (CMOS) configuration. So, as a configuration having high process affinity with the internal circuit, there has been proposed an ESD protective circuit having a so-called RCMOS configuration using a CMOS circuit such as an inverter in addition to a detecting circuit using a resistor (R) and a capacitor (C) (refer to Japanese Patent Laid-open No. 2006-121007 (hereinafter, Patent Document 1) and C. A. Torres et al; "Modular, Portable, and Easily Simulated ESD Protection Networks for Advanced CMOS Technologies," Electrical Overstress/Electrostatic Discharge Symposium, September 11-13. Symposium Proceedings, pp. 81-94, FIG. 1).

The circuit configuration of the ESD protective circuit having the RCMOS configuration is the same as that of FIG. 1, which relates to the disclosed technique of the present application.

An ESD protective circuit 1 shown in FIG. 1 is configured by connecting a resistive element R, a capacitive element C, a CMOS inverter circuit 4, and a protection MOS transistor 5 between a power supply line 2 and a ground line 3 as shown in the diagram.

Specifically, in the ESD protective circuit 1, the MOS transistor (hereinafter, protection MOS transistor) 5 that discharges a high voltage generated in the power supply line 2 attributed to an ESD to the ground line 3 is disposed between the power supply line 2 and the ground line 3. The drain and source of the protection MOS transistor 5 are connected to the power supply line 2 and the ground line 3, respectively. Furthermore, the resistive element R and the capacitive element C are connected in series between the power supply line 2 and the ground line 3 to configure an RC series circuit. In addition, the inter-element node is connected to the input of the CMOS inverter circuit 4 and the output of the CMOS inverter circuit 4 is connected to the gate of the protection MOS transistor 5.

This ESD protective circuit is so designed as not to react to normal potential rise and fluctuation of the power supply line by utilizing a time constant based on the resistive element R and the capacitive element C.

In the case of intentionally raising the potential of the power supply line like the case of normal power activation, the rising speed of the pulse is lower than that at the time of ESD surge generation. Therefore, a potential VRC of the node connecting the resistive element R and the capacitive element C rises up without a long delay from the rise of the potential of the power supply line.

In contrast, if a pulse with a frequency higher than that assumed in normal operation (e.g. ESD surge) is applied to the power supply line 2, the potential VRC of the node connecting the resistive element R and the capacitive element C in the RC series circuit rises up with a delay from the potential rise of the power supply line 2. The potential rise in the human body model (HBM), which is a representative model of the ESD, occurs in an extremely-short time of several hundreds of nanoseconds, and the time constant of the RC series circuit is so decided that the above-described potential VRC rises up with a delay from the potential rise of the power supply line 2 responding to the potential rise with such a high frequency.

If the potential VRC rises up with a delay from the rise of the potential of the power supply line, a positive pulse generated in the CMOS inverter circuit 4 is applied to the gate of the protection MOS transistor 5 for only the period until the potential VRC reaches the threshold value of the inverter of the CMOS inverter circuit 4.

Thus, the protection MOS transistor 5 is in the on-state for the time defined by this positive pulse to remove the ESD surge from the power supply line 2 to the ground line 3. Therefore, an internal circuit 6 connected between the power supply line 2 and the ground line 3 is protected from the ESD surge.

When the potential VRC reaches the threshold value of the inverter of the CMOS inverter circuit 4, the positive pulse applied to the gate of the protection MOS transistor 5 ends, and thus this transistor is immediately turned off.

In this manner, the ESD protective circuit having the RCMOS configuration detects the ESD surge by the detecting circuit (RC series circuit) using a resistor (R) and a capacitor (C) and immediately removes the ESD surge from the power supply line in response to the detection result by this detecting circuit.

SUMMARY

By the way, although the above-described ESD protective circuit operates, the potential of the power supply line does not become completely zero because of the on-resistance of the protection MOS transistor and so forth.

Thus, even when the protection MOS transistor of the ESD protective circuit is in the on-state, the potential difference arising between the power supply line and the ground line (clamp voltage) is applied to the internal circuit.

The clamp voltage is generally higher than a supply voltage VDD provided by the power supply line. Therefore, the clamp voltage needs to be set lower than the breakdown voltage of the internal circuit in order to protect the internal circuit from a high voltage due to the ESD.

When the gate width of the protection MOS transistor, i.e. the gate size in the direction perpendicular to the direction of the flow of the channel current, is increased, the clamp voltage can be lowered. This is because the on-resistance decreases and the discharge capability of the transistor is enhanced as the gate width increases.

Along with recent microminiaturization of the semiconductor technique, the breakdown voltage of the gate insulating film of the MOS transistor used in the internal circuit is drastically decreasing.

In association with this, requirements for reduction in the clamp voltage are becoming strong and therefore the on-resistance of the protection MOS transistor is required to be reduced.

To reduce the on-resistance, it is preferable to decrease the gate length, i.e. the gate size in the direction of the flow of the channel current, besides to increase the gate width. More restrictively, it is preferable to decrease the gate length of the protection MOS transistor as much as possible on condition that it is at least the minimum value allowed in the manufacturing step.

On the other hand, in recent years, enhancement in the integration degree and function of the semiconductor integrated circuit is being advanced and increase in the power consumption in association with increase in the number of mounted elements is becoming more serious.

For reduction in the unnecessary leakage current, demands for suppression of the leakage current of the ESD protective circuit in its normal operation without the occurrence of an electrostatic discharge are high.

The dominant leakage current components of the leakage current in the ESD protective circuit are a subthreshold leakage current flowing through the protection MOS transistor in the off-state, a substrate current, and so forth.

The subthreshold leakage current is a leakage current flowing between the source and drain of the protection MOS transistor. The substrate current is a junction leakage current that flows when a reverse bias is applied to a PN junction and a gate induced drain leakage (GIDL) current that flows from the drain to the substrate because the drain under the gate electrode is affected by the gate potential. Because generally the subthreshold leakage current increases as the gate length becomes smaller, it is the most effective to set the gate length larger for suppression thereof.

However, as described above, setting the gate length of the protection MOS transistor larger increases the on-resistance of the protection MOS transistor, which leads to increase in the clamp voltage. Furthermore, setting the gate length larger increases the occupation area of the ESD protective circuit and increases the manufacturing cost of the semiconductor integrated circuit using this ESD protective circuit.

In contrast, setting the gate width larger is effective to reduce the on-resistance but increase in the leakage current and the area is more significant compared with the case of setting the gate length larger.

So, presently, the gate length of the protection MOS transistor is set somewhat larger than that of the transistor of the internal circuit in order to reduce the leakage current to some extent. However, the on-resistance becomes the prey of this and reduction in the clamp voltage is not progressed. Therefore, it is expected that hovering of the clamp voltage at a high voltage is attracting attention as a large improvement more than ever in association with lower-voltage operation of the semiconductor integrated circuit.

Furthermore, in the ESD protective circuit having the RCMOS configuration, in normal operation without the occurrence of an ESD surge, the gate of the protection MOS transistor is biased in a voltage direction toward turning-on thereof and the leakage current increases in some cases, although the protection MOS transistor is not turned on actually.

For example, the potential of the supply voltage line constantly varies due to the influence of switching noise because it is connected to various internal circuits that perform high-speed switching operation, or due to inductive noise of neighboring signal lines. The variation width of the power supply line potential due to such noise is sufficiently smaller than the potential variation width (wave height value) due to ESD noise, and the ESD protective circuit is so designed as not to work responding to noise with such a small variation width. Thus, in FIG. 1, the protection MOS transistor 5 is not turned on even when noise with a small variation width is generated in the power supply line 2.

However, because the variation of the power supply line potential includes high frequency components, the detecting circuit responses to this potential variation also when the protection MOS transistor 5 is in the off-state, and constantly fluctuates the gate potential of the protection MOS transistor 5 in the off-state. Therefore, the leakage current temporarily increases when the gate potential of the protection MOS transistor 5 in the off-state is swung toward the side of turning-on of this transistor.

If such increase and decrease in the leakage current are repeated in the operation, useless power consumption is caused.

As a countermeasure against this useless power consumption due to increase in the leakage current, in the above-described Patent Document 1, the gate of the protection MOS transistor is connected to the ground line by a pull-down resistor to suppress the gate potential variation.

However, this countermeasure involves a disadvantage that the circuit area becomes larger corresponding to the space for the pull-down resistor and wiring thereof.

There is a need for the technique of the present disclosure to provide a semiconductor integrated circuit having a protective circuit that allows suppression of the leakage current and simultaneously increase prevention or decrease of the clamp voltage in normal operation after power activation of this semiconductor integrated circuit, and involves less variation of the gate potential of the protection MOS transistor.

There is another need for the technique of the present disclosure to provide a manufacturing method that easily realizes a semiconductor integrated circuit having a protective circuit having the above-described advantages.

According to an embodiment of the technique of the present disclosure, there is provided a semiconductor integrated circuit including a protected circuit configured to be connected to two power supply lines that provide a supply voltage, a detecting circuit configured to include a resistive element and a capacitive element connected in series between two power supply lines and detect a surge generated in the power supply line based on potential variation of an inter-element connecting node. The semiconductor integrated circuit further includes a protection transistor configured to be connected between two power supply lines and have a control electrode connected to an output of the detecting circuit. The protected circuit, the detecting circuit, and the protection transistor are formed in the same semiconductor substrate. The protection transistor has one of the control electrode formed from a different electrode material having a work function difference from a transistor of the same channel conductivity type in the protected circuit and the control electrode formed from a semiconductor electrode material of a different conductivity type for making a work function difference, to have a different threshold voltage from the transistor so that the amount of leakage current per unit channel width may be smaller compared with the transistor.

According to this configuration, without changing the gate size that affects the clamp voltage, the amount of leakage current is greatly reduced, with the clamp voltage kept or on the contrary decreased.

Specifically, the threshold voltage of the protection transistor can be set higher than that of the transistor having the channel of the same first conductivity type (hereinafter, transistor of the first conductivity type), included in the protected circuit.

Therefore, in this case, an allowance for setting the gate length smaller with suppression of increase in the subthreshold leakage current compared with the transistor of the first conductivity type included in the protected circuit is generated. Furthermore, an allowance for decreasing the on-resistance of the protection transistor is generated. Moreover, an allowance for lowering the clamp voltage, which clamps two power supply lines when the protective circuit operates, is generated.

In addition, because the threshold voltage of the protection transistor is high, the leakage current increases less readily even when the gate potential varies.

According to another embodiment of the technique of the present disclosure, there is provided a manufacturing method of a semiconductor integrated circuit including a protected circuit connected to two power supply lines that provide a supply voltage, a resistive element and a capacitive element connected in series between two power supply lines, and a protection transistor that operates based on potential variation of a connecting node of the resistive element and the capacitive element. The protected circuit, the resistive element, the capacitive element, and the protection transistor are formed in the same semiconductor substrate. The protection transistor and a transistor having a channel of a first conductivity type in the protected circuit are formed in the semiconductor substrate with separation into two wells of a second conductivity type. A transistor having a channel of the second conductivity type in the protected circuit is formed in a well of the first conductivity type in the semiconductor substrate. The manufacturing method includes forming two wells of the second conductivity type and the well of the first conductivity type in the semiconductor substrate, depositing a multilayer film composed of a gate insulating film and a polycrystalline silicon film over each of the formed wells and processing the polycrystalline silicon film to form gate electrodes, and forming a source region and a drain region having the opposite conductivity type to a corresponding one of the wells in each of two wells of the second conductivity type and the well of the first conductivity type. In the forming of the source region and the drain region, an impurity of the second conductivity type is introduced into the gate electrode of the transistor having the channel of the second conductivity type and an area in the well of the first conductivity type and simultaneously the impurity of the second conductivity type is introduced also into the gate electrode of the protection transistor.

According to the above-described configuration, by merely changing the mask of the ion implantation, a semiconductor integrated circuit in which the amount of leakage current is greatly reduced, with the clamp voltage kept or on the contrary decreased, is manufactured without changing the gate size that affects the clamp voltage.

According to the technique of the present disclosure, it is possible to provide a semiconductor integrated circuit having a protective circuit that allows suppression of the leakage current and simultaneously increase prevention or decrease of the clamp voltage in normal operation after power activation of this semiconductor integrated circuit, and involves less variation of the gate potential of the protection MOS transistor.

Furthermore, according to the technique of the present disclosure, a manufacturing method that easily realizes a semiconductor integrated circuit having a protective circuit with the above-described advantages can be provided.

BRIEF DESCRIPTION OF THE DRAWINGS

FIG. 2 is a discharge current characteristic diagram of the ESD protective circuit obtained by evaluation with use of a TLP device;

DETAILED DESCRIPTION OF THE PREFERRED EMBODIMENTS

A semiconductor integrated circuit having a protective circuit relating to the technique of the present disclosure will be described below with reference to the drawings by taking the case of having an ESD protective circuit as a representative example.

The description will be made in the following order.
1. First Embodiment: embodiment in which work function difference of gate electrode is made is disclosed.
2. Second Embodiment: embodiment in which furthermore drain region formed of low-concentration impurity region is removed is disclosed.
3. Effects (evaluation results) of first and second embodiments are explained.
4. Modification Example: circuit modification example in which channel conductivity type of protection MOS transistor is set to P-type is disclosed.

1. First Embodiment

[Circuit Configuration of Protective Circuit]

Figure 1:
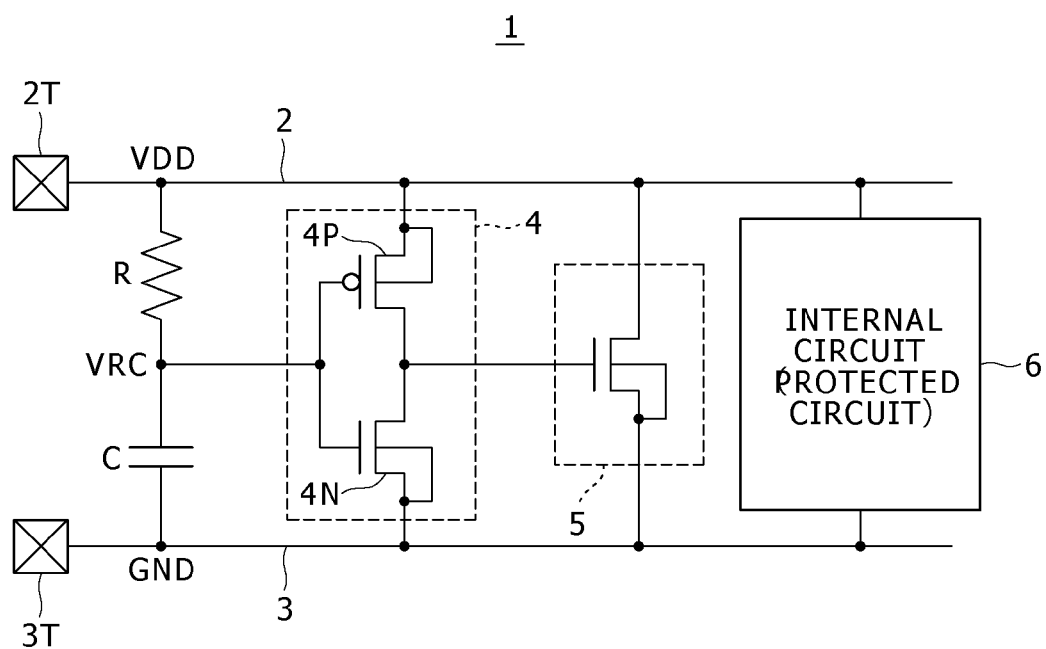
FIG. 1 is a circuit configuration diagram of an ESD protective circuit relating to the technique of the present disclosure.

FIG. 1 is a diagram showing the circuit configuration of an ESD protective circuit relating to the technique of the present disclosure.

An ESD protective circuit 1 having an RCMOS configuration shown in FIG. 1 has a power supply line 2 as the "supply voltage line" to which a power supply terminal 2T is connected and a ground line 3 to which a ground terminal 3T is connected as the "reference voltage line." The power supply line 2 and the ground line 3 are equivalent to an example of "two power supply lines that provide a supply voltage." The supply voltage VDD is applied between the power supply line 2 and the ground line 3.

The internal circuit (protected circuit) 6 that is connected to the power supply line 2 and the ground line 3 and is provided with the supply voltage VDD is disposed.

All circuit elements other than the internal circuit 6 connected to the power supply line 2 and the ground line 3 configure the ESD protective circuit 1 whose protection subject is the internal circuit 6.

In the ESD protective circuit 1, a resistive element R, a capacitive element C, a CMOS inverter circuit 4, and a protection MOS transistor 5 as one example of the "protection transistor" are provided between the power supply line 2 and the ground line 3.

In the present embodiment, the protection MOS transistor 5 is a transistor whose conductivity type of the channel is the N-type. The drain is connected to the power supply line 2 and the source is connected to the ground line 3. Furthermore, the substrate region of the protection MOS transistor 5 (e.g. P-type well to be described later) is electrically short-circuited to the source. This configuration is not essential although it is desirable for stable operation.

The protection MOS transistor 5 has a function to discharge e.g. a positive high voltage pulse (e.g. ESD surge) that is generated in the power supply line 2 via the power supply terminal 2T attributed to an ESD to the ground line 3.

An RC series circuit (detecting circuit) obtained by connecting the resistive element R connected to the side of the power supply line 2 and the capacitive element C connected to the side of the ground line 3 in series is connected between the power supply line 2 and the ground line 3. In the detecting circuit, the connecting node between the resistive element R and the capacitive element C is connected to the input of the CMOS inverter circuit 4.

The CMOS inverter circuit 4 has a PMOS transistor 4P and an NMOS transistor 4N connected in series between the power supply line 2 and the ground line 3.

The common gate of the PMOS transistor 4P and the NMOS transistor 4N is connected to the inter-element node between the resistive element R and the capacitive element C. Furthermore, the common drain of the PMOS transistor 4P and the NMOS transistor 4N is connected to the gate (control electrode) of the protection MOS transistor 5.

When a positive high voltage pulse (e.g. ESD surge) is generated in the power supply line 2, the potential VRC of the inter-element node between the resistive element R and the capacitive element C rises up with a delay from potential change of the power supply line 2. The CMOS inverter circuit 4 is a circuit that controls the control electrode (gate) of the protection MOS transistor 5 based on this variation of the potential VRC.

The more detailed operation of the above-described ESD protective circuit 1 is as follows.

In the normal VDD-supplied state without the occurrence of an electrostatic discharge (ESD), the potential VRC of the connecting node between the resistive element R and the capacitive element C is higher than the threshold voltage of the CMOS inverter circuit 4. Therefore, the NMOS transistor 4N of the CMOS inverter circuit 4 is in the on-state (conductive state) and the PMOS transistor 4P is in the off-state (non-conductive state). At this time, in the CMOS inverter circuit 4, the state between the input and the output is the high impedance state and the output is in the state of low impedance connection with the ground line 3 to supply a ground voltage GND. Therefore, the CMOS inverter circuit 4 stably keeps the protection MOS transistor 5 on the output side at the off-state (non-conductive state) irrespective of minute potential variation on the input side.

The potential of the power supply line 2 is often intentionally raised in normal operation e.g. at the time of power activation. However, the rise speed of such potential rise of the power supply line 2 in normal operation is lower than that of potential rise due to an ESD surge (e.g. rapid potential rise in several hundreds of nanoseconds). Thus, the potential VRC rises up in such a manner as to substantially conform with the potential rise of the power supply line 2. Therefore, such a long delay of potential rise as to turn on the protection MOS transistor 5 does not occur in the potential VRC.

In contrast, when a positive high voltage pulse due to an ESD is instantaneously applied to the power supply line 2, the potential VRC of the connecting node between the resistive element R and the capacitive element C rises up with a delay from potential change of the power supply line 2. The amount of delay of this potential rise is determined by the time constant of the RC series circuit (detecting circuit) composed of the resistive element R and the capacitive element C. When the resistance value of the resistive element R and the capacitance value of the capacitive element C are larger, the amount of delay also increases.

FIG. 2 shows one example of the discharge characteristic of the ESD protective circuit 1, obtained by evaluation with use of a transmission line pulse (TLP) device that applies a pulse-like surge. In FIG. 2, the abscissa indicates the wave height value (discrete values from 0.0 V to 7.0 V) of the pulse voltage generated in the power supply line and the ordinate indicates the value of the discharge current flowing from the power supply line 2 to the ground line 3 in FIG. 1 at this time.

As described above, when a positive high voltage pulse due to an ESD is generated in the power supply line 2, the potential VRC of the connecting node between the resistive element R and the capacitive element C rises up with a delay from the potential rise of the power supply line 2. In FIG. 2, the voltage of the power supply line with which the discharge current rises up (about 1.0 V) indicates the voltage of the power supply line 2 when the state changes from the state in which the whole charge amount at the time of generation of the above-described pulse is consumed for charge/discharge of the capacitive element C to the state in which part of the charge starts to flow to the ground line.

When a pulse voltage higher than a certain predetermined value (>1.0 V) is generated in the middle of repetition of the pulse application with raising of the voltage value, the NMOS transistor 4N is turned off and the PMOS transistor 4P is turned on for only the period in which the potential VRC is lower than the threshold voltage of the CMOS inverter circuit 4 in this pulse generation period.

At this time, potential change that corresponds to input potential change and has the inverted polarity is output from the CMOS inverter circuit 4 and an ESD current flows from the power supply line 2 to the ground line 3 depending on the gate potential of the protection MOS transistor 5. The potential variation of the power supply line 2 at this time is detected.

The magnitude of such a pulse voltage with which the inverter starts to respond is determined depending on the value of power supply variation that is an unsteady pulse voltage that is no longer regarded as normal supply voltage variation and should be removed as an ESD surge.

In response to the positive high pulse voltage (e.g. ESD surge) generated in the power supply line, the protection MOS transistor 5 is turned on, although for a short period, with high responsiveness by a detection signal of a short active period output from the CMOS inverter circuit 4.

Thus, the high voltage pulse such as an ESD surge is rapidly removed via the protection MOS transistor 5 that is in the on-state and has impedance lower than that of the RC series circuit.

Therefore, the internal circuit 6 is protected from the high voltage pulse such as an ESD surge.

The certain delay period from the occurrence of potential change in the power supply line 2 to the response of the potential VCR between the elements is approximately determined by the time constant obtained by multiplying the capacitance value of the capacitive element C and the resistance value of the resistive element R.

The relative time relationship between the variation time of the potential VRC and the period during which the level capable of setting the protection MOS transistor 5 to the on-state is kept in the detection signal output from the CMOS inverter circuit 4 is adjusted based on the characteristics of the CMOS inverter circuit 4 and so forth.

The resistive element R used in the above-described ESD protective circuit may be configured by e.g. a MOS transistor, a well region in the semiconductor substrate, an impurity region, or a polycrystalline silicon film. The capacitive element C can be configured by e.g. MOS capacitance or wiring capacitance.

The operation that should be carried out by the CMOS inverter circuit 4 is to set a high impedance state between the connecting node of the resistive element R and the capacitive element C and the gate electrode of the protection MOS transistor 5 when a positive high voltage pulse such as an ESD surge is not applied in normal operation. Furthermore, the gate potential of the protection MOS transistor 5 should be biased by the CMOS inverter circuit 4 so that the protection MOS transistor 5 may be set to the off-state. Moreover, the CMOS inverter circuit 4 should carry out also the following operation. Specifically, when a positive high voltage pulse is detected, the CMOS inverter circuit 4 inverts potential variation applied to its input and transmits the inverted potential variation to the output side with low impedance to thereby instantaneously turn on the protection MOS transistor 5 for only a short time with high responsiveness.

It is also possible to employ a circuit having another configuration instead of the CMOS inverter circuit 4 as long as the circuit is capable of such operation.

Furthermore, if useful characteristic adjustment is permitted through increase in the number of stages, it is also possible to set the number of stages of the CMOS inverter circuit 4 to an odd number larger than 1.

[Structure of Protection MOS Transistor]

Figure 3:
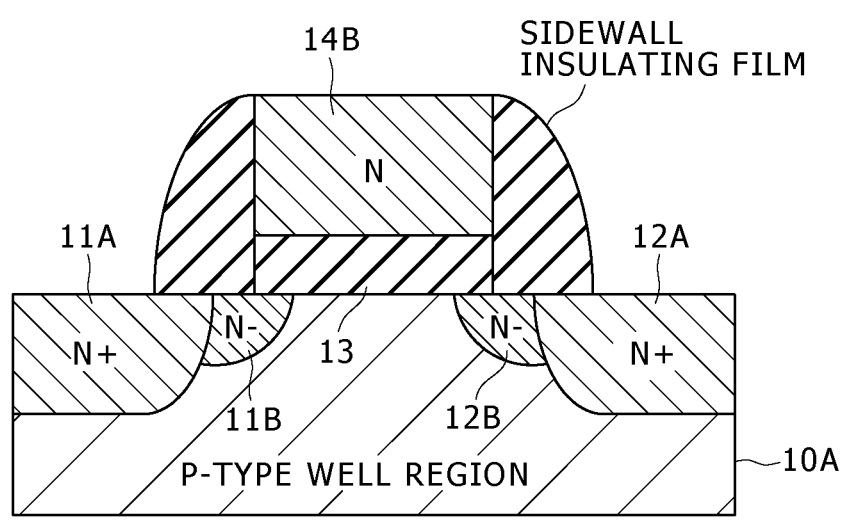
FIG. 3 is a sectional structure diagram of a general protection MOS transistor to which the technique of the present disclosure is not applied.

FIG. 3 is a sectional structure diagram of a general protection MOS transistor to which the technique of the present disclosure is not applied.

An NMOS transistor having the same conductivity type of the gate electrode as that of the NMOS transistor included in the internal circuit is used as a protection MOS transistor 5A. This NMOS transistor (protection MOS transistor 5A) has a gate electrode 14B composed of N-type polycrystalline silicon.

The other structure is similar to the structure of the protection MOS transistor 5, to which the technique of the present disclosure is applied, described next with use of FIG. 4. Therefore, the same numerals as those in FIG. 4 are given and explanation thereof is left to explanation of FIG. 4.

Figure 4:
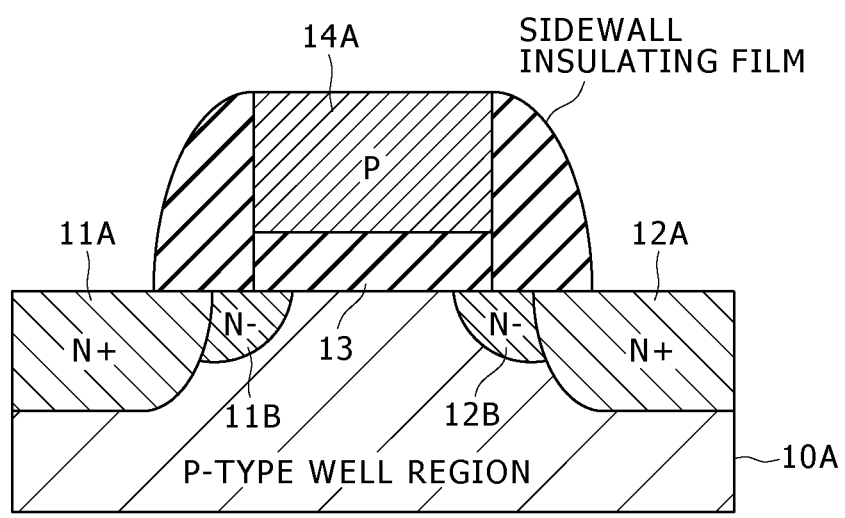
FIG. 4 is a sectional structure diagram of a protection MOS transistor relating to a first embodiment in the technique of the present disclosure.

FIG. 4 shows the sectional structure of the protection MOS transistor 5 relating to a first embodiment in the technique of the present disclosure.

In the vicinity of the surface of a P-type well region 10A formed in a silicon semiconductor substrate, an $N^+$ source impurity region 11A doped with an N-type impurity at high concentration and an $N^-$ source impurity region 11B whose impurity concentration is lower than that of the $N^+$ source impurity region 11A are formed.

Furthermore, with the intermediary of the channel forming region to be located immediately beneath the gate electrode to be described later, an $N^+$ drain impurity region 12A doped with an N-type impurity at high concentration and an $N^-$ drain impurity region 12B whose impurity concentration is lower than that of the $N^+$ drain impurity region 12A are formed in the vicinity of the surface of the P-type well region 10A.

The $N^-$ source impurity region 11B and the $N^-$ drain impurity region 12B are often referred to also as lightly doped drain (LDD) region or extension region. When they are referred to as the extension region, for example on the source side, it is not necessarily required that the concentration of the impurity region shown by numeral 11B is lower than that of the impurity region shown by numeral 11A. This applies also to two impurity regions shown by numerals 12A and 12B on the drain side.

A gate insulating film 13 is formed on the surfaces of part of the $N^-$ source impurity region 11B and the $N^-$ drain impurity region 12B and the channel forming region sandwiched by the $N^-$ source impurity region 11B and the $N^-$ drain impurity region 12B.

Furthermore, a gate electrode 14A formed of a P-type polycrystalline silicon film is formed on the gate insulating film 13. A silicide layer (not shown) may be formed on the polycrystalline silicon film and on the impurity region for resistance lowering.

By employing a P-type semiconductor material, e.g. P-type polycrystalline silicon, as the electrode material of the gate electrode 14A of the protection MOS transistor 5 as just described, the threshold voltage of the protection MOS transistor 5 can be set higher than that of the NMOS transistor in the internal circuit 6 (FIG. 1).

This can set the gate length smaller with suppression of increase in the subthreshold leakage current compared with the protection MOS transistor 5A (NMOS transistor), to which the technique of the present disclosure is not applied, shown in FIG. 3. As a result, the on-resistance of the protection MOS transistor 5 is decreased and the clamp voltage of the ESD protective circuit 1 can be lowered.

Furthermore, although a pull-down resistor and connection wiring thereof are not provided differently from the above-described Patent Document 1, the protection MOS transistor 5 shows less variation of the gate potential because it has a high threshold voltage. This reduces the leakage current generated due to variation of the gate potential of the protection MOS transistor attributed to potential variation of the power supply line due to power supply noise and so forth.

[Manufacturing Method of Protection MOS Transistor (Manufacturing Method 1 of First Embodiment)]

One example of a manufacturing method (manufacturing method 1) of the protection MOS transistor 5 of FIG. 4 relating to the first embodiment in the technique of the present disclosure will be described below with use of the respective step sectional views of FIGS. 5A to 5G.

Figure 5A:
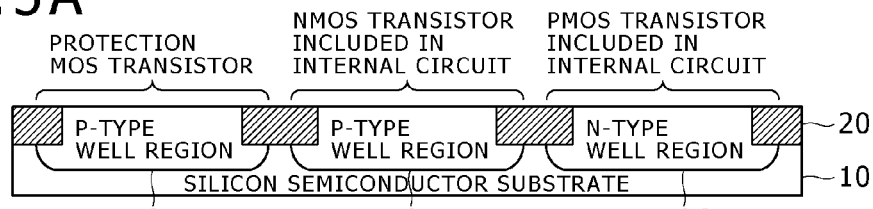
FIGS. 5A to 5G are step sectional views showing a manufacturing method of the first embodiment.

First, in a step of FIG. 5A, shallow trench isolation (STI) obtained by burying a silicon oxide film or the like in trenches formed in a silicon semiconductor substrate 10 is formed as element isolation regions 20.

Next, a P-type well region 10B to form the NMOS transistor included in the internal circuit (hereinafter, referred to simply as the "NMOS transistor") is formed by an ion implantation method. Similarly, an N-type well region 10C to form the PMOS transistor included in the internal circuit (hereinafter, referred to simply as the "PMOS transistor") is formed by an ion implantation method. Furthermore, the P-type well region 10A to form the protection MOS transistor 5 is formed by an ion implantation method. The P-type well region 10B to form the NMOS transistor and the P-type well region 10A to form the protection MOS transistor 5 may be simultaneously formed.

Moreover, in order to adjust the threshold voltage, impurity regions of the same conductivity type as that of the well region are formed near the surface of the silicon semiconductor substrate by an ion implantation method (not shown).

Figure 5B:
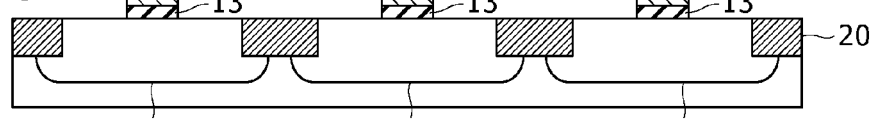

Next, in a step of FIG. 5B, the gate insulating film 13 and a polycrystalline silicon film are formed by e.g. a CVD method. The gate insulating film 13 and the polycrystalline silicon film in the unnecessary area are removed by using a photoresist layer (not shown) processed into a desired pattern shape by a photolithography technique. Thus, polycrystalline silicon layers 14 to serve as the gate electrodes are formed.

Figure 5C:
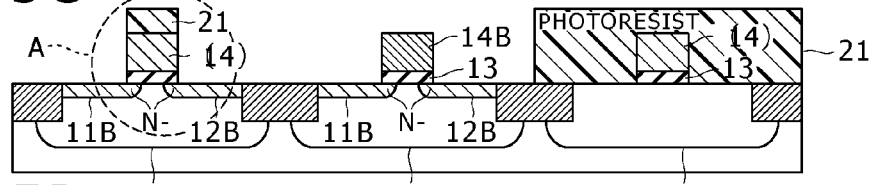

In a step of FIG. 5C, the N⁻ source impurity regions 11B and the N⁻ drain impurity regions 12B are formed by an ion implantation method.

At this time, a photoresist layer 21 covering the area into which the N-type impurity is not implanted is formed also on the gate electrode 14 of the protection MOS transistor 5 in addition to the PMOS transistor area. The N-type impurity is ion-implanted with use of the photoresist layer 21 formed in this manner as a mask. Thus, the N⁻ source impurity region 11B and the N⁻ drain impurity region 12B are simultaneously formed in the forming areas of the protection MOS transistor 5 and the NMOS transistor. Furthermore, simultaneously the polycrystalline silicon layer 14 of the NMOS transistor is turned to the N-type and becomes the gate electrode formed of the N-type polycrystalline silicon layer 14B (hereinafter, represented by using the same numeral 14B).

Figure 5D:
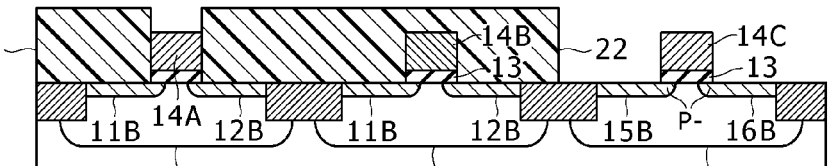

In a step of FIG. 5D, a P⁻ source impurity region 15B and a P⁻ drain impurity region 16B are formed by an ion implantation method in the forming area of the PMOS transistor. At this time, the ion implantation of the P-type impurity is performed after a photoresist layer 22 that blocks the ion implantation is formed. The photoresist layer 22 is not formed in the forming area of the PMOS transistor but formed in the forming areas of the NMOS transistor and the protection MOS transistor 5. However, part of the photoresist layer 22 is opened so that the P-type impurity may be implanted also into the polycrystalline silicon layer 14 to serve as the gate electrode of the protection MOS transistor.

Therefore, simultaneously with the forming of the P⁻ source impurity region 15B and the P⁻ drain impurity region 16B, the polycrystalline silicon layer 14 is turned to the P-type and becomes the gate electrode 14A in the forming area of the protection MOS transistor.

Thereafter, the photoresist layer 22 is removed.

Figure 5E:
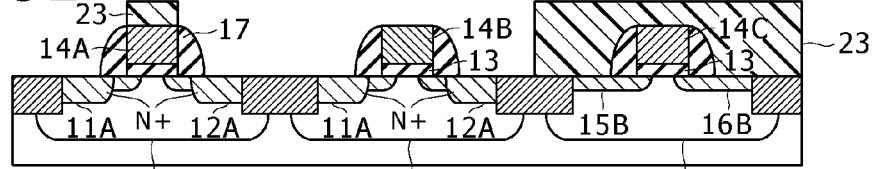

In the next step of FIG. 5E, first, sidewall insulating films 17 are formed.

In the forming step of the sidewall insulating film 17, an insulating film is deposited to a large thickness over the whole surface and the insulating film is etched back by anisotropic etching, although not particularly shown in the diagram. At this time, the sidewall insulating film 17 is left on the sidewall of each gate electrode attributed to the anisotropy of the etching.

Thereafter, in the step of FIG. 5E, the N⁺ source impurity regions 11A and the N⁺ drain impurity regions 12A are formed by an ion implantation method. At this time, the ion implantation of the N-type impurity is performed after a photoresist layer 23 that blocks the ion implantation is formed. The photoresist layer 23 covers the forming area of the PMOS transistor and is widely opened in the forming areas of the NMOS transistor and the protection MOS transistor 5. However, as shown in FIG. 5E, the photoresist layer 23 is formed also on the gate electrode 14A in order to block introduction of the N-type impurity into the gate electrode 14A of the protection MOS transistor. When the N-type impurity is ion-implanted at high concentration, the N⁺ source impurity region 11A and the N⁺ drain impurity region 12A are simultaneously formed in the protection MOS transistor 5 and the NMOS transistor.

After the ion implantation, the photoresist layer 23 is removed.

Figure 5F:
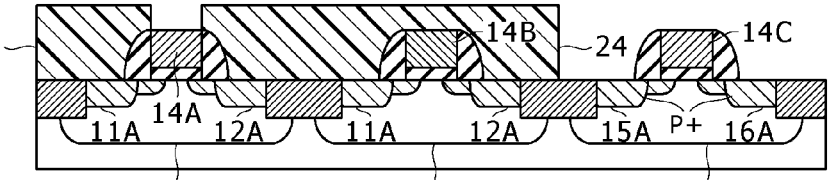

Subsequently, in a step of FIG. 5F, a P⁺ source impurity region 15A and a P⁺ drain impurity region 16A are formed by an ion implantation method. At this time, the ion implantation of the P-type impurity is performed after a photoresist layer 24 that blocks the ion implantation is formed. The photoresist layer 24 is so formed as to be opened in the forming area of the PMOS transistor and almost cover the forming areas of the NMOS transistor and the protection MOS transistor 5. However, as shown in FIG. 5F, the photoresist layer 24 is opened on the gate electrode 14A in order to additionally introduce the P-type impurity into the gate electrode 14A of the protection MOS transistor. When the P-type impurity is ion-implanted at high concentration, the P⁺ source impurity region 15A and the P⁺ drain impurity region 16A are simultaneously formed in the PMOS transistor.

If sufficient concentration is obtained merely by implanting the P-type impurity into the gate electrode 14A of the protection MOS transistor 5 in the step of FIG. 5F, the P-type impurity does not need to be implanted into the gate electrode 14A in the step of FIG. 5D.

Figure 5G:
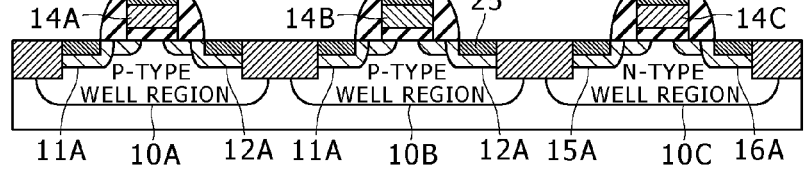

Next, in a step of FIG. 5G, silicide layers 25 are formed. The silicide layers 25 are formed in order to suppress the resistance of the impurity regions and so forth to low resistance.

In the forming method of the silicide layer 25, first, the partial area of the gate electrode and the impurity region requiring no silicide layer is protected by a mask material. Thereafter, a metal film of e.g. nickel (Ni), tungsten (W), cobalt (Co), or titanium (Ti) is deposited and then the metal is made to react with the silicon by heat treatment, followed by removal of the unreacted metal.

FIG. 5G shows the case in which the silicide layer 25 is formed for all gates 14 (14A to 14C).

In general, the area that is protected by the above-described mask material to be free from the forming of the silicide layer 25 therein and thus has a resistance value higher than that of the area in which the silicide layer 25 is formed is referred to as the silicide block area.

Figure 6:
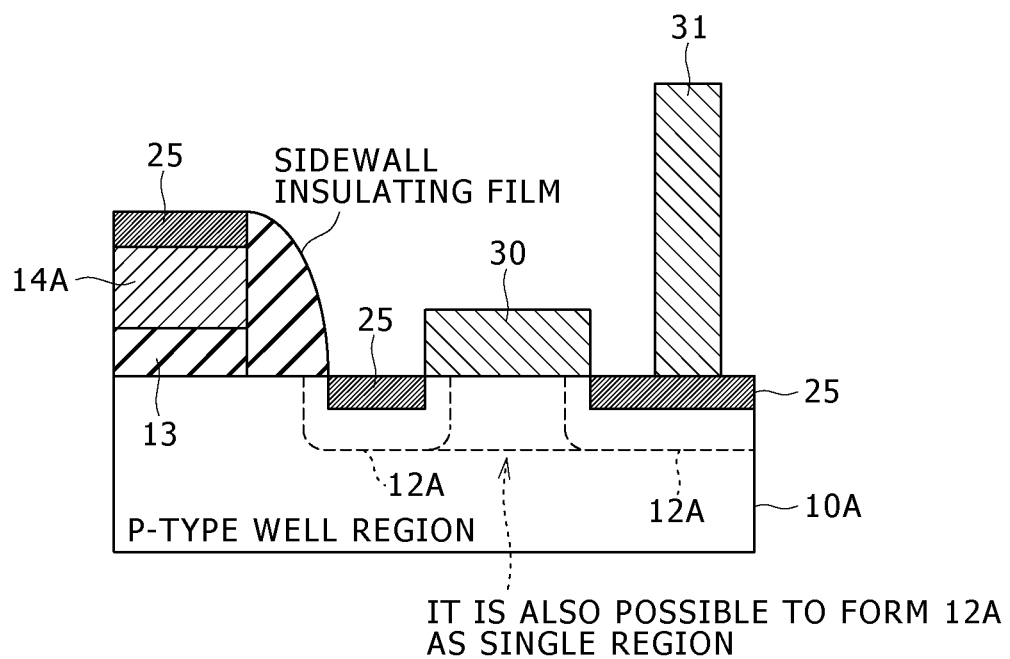
FIG. 6 is a partial sectional view of a protection MOS transistor having a silicide block area in an impurity region.

FIG. 6 shows a partial sectional view of the protection MOS transistor 5 having the silicide block area in the impurity region. A mask material 30 for silicide block may be formed for part or the whole of the impurity region. Furthermore, the mask material 30 for silicide block may be formed for only the drain impurity region, or for only the source impurity region, or for the drain impurity region and the source impurity region. The mask material 30 for silicide block may be formed on the gate electrode 14.

By forming the silicide layer 25, the resistance of the impurity region of the NMOS transistor and the PMOS transistor included in the internal circuit is decreased to ensure high-speed operation of these transistors. On the other hand, if the impurity region having relatively high resistance due to avoidance of resistance lowering by silicide block is made, a high voltage due to an ESD applied to the protection MOS transistor 5 can be alleviated. This can suppress the focusing of a large current due to the ESD on the protection MOS transistor 5 and breakdown of the protection MOS transistor 5.

For example, the N+ drain region 12A of the protection MOS transistor shown in FIG. 6 has a structure in which the silicide layer 25 is not formed at part of the area from a contact plug 31 to the channel forming region because of the mask material 30 for silicide block.

This area under the mask material 30 is an area having relatively high resistance because the silicide layer 25 does not exist. This high resistance area acts to alleviate electric field focusing at the channel-side end part of the N− drain region 12B (not shown in FIG. 6) similarly to a so-called ballast resistor. Due to this, a large current due to an ESD does not focus on the channel-side end part of the protection MOS transistor 5 and thus breakdown of the protection MOS transistor 5 can be suppressed.

If ion implantation of an N-type impurity is performed in the step of FIG. 5E after the mask material 30 is formed, the N+ drain region 12A shown in FIG. 6 is so formed as to be separated under the mask material 30. In contrast, if the mask material 30 is formed after the ion implantation for forming the N+ drain region 12A, the N+ drain region 12A is formed as a single region. The shape of the N+ drain region 12A may be either of them.

In the manufacturing method described above with use of FIGS. 5A to 5G (FIG. 6), the gate electrode 14B of the NMOS transistor can be turned to N-type polycrystalline silicon. Furthermore, the gate electrode 14C of the PMOS transistor can be turned to P-type polycrystalline silicon and the gate electrode 14A of the protection MOS transistor 5 can be turned to P-type polycrystalline silicon.

Moreover, according to the manufacturing method of FIGS. 5A to 5G, the number of manufacturing steps does not increase compared with the case of forming only the NMOS transistor and the PMOS transistor although the protection MOS transistor 5 having the P-type polycrystalline silicon is formed.

[Manufacturing Method of Protection MOS Transistor (Manufacturing Method 2 of First Embodiment)]

Next, another manufacturing method (manufacturing method 2) that can be employed will be described.

First, after the gate insulating film 13 is deposited in the step of FIG. 5B, an N-type polycrystalline silicon film doped with an N-type impurity at high concentration in advance is deposited by e.g. a CVD method. Next, the N-type polycrystalline silicon film of the unnecessary area is removed by using a photoresist layer whereas the silicon film of the area to become the gate electrode 14B of the NMOS transistor is left.

Subsequently, after a P-type polycrystalline silicon film doped with a P-type impurity at high concentration in advance is deposited, the P-type polycrystalline silicon film of the unnecessary area is removed by using a photoresist layer whereas the silicon film of the areas to become the gate electrodes 14C and 14A of the PMOS transistor and the protection MOS transistor 5 is left. Thereafter, the unnecessary gate insulating film 13 is removed.

According to such a method, the impurity concentration of the gate electrode 14 and the impurity concentration of the impurity region can be independently set, and adjustment of the work functions of the polycrystalline silicon gate electrodes 14A and 14B becomes easy.

In the step shown in FIG. 5C in this manufacturing method 2, the gate electrode (polycrystalline silicon layer 14) of the protection MOS transistor 5 is protected by the photoresist layer 21 similarly to the above-described manufacturing method 1. In this manufacturing method 2, in addition to this, the gate electrode (polycrystalline silicon layer 14) of the NMOS transistor may also be protected by the photoresist layer 21. However, it is also possible that the gate electrode of the NMOS transistor is not protected by the photoresist layer 21 and additional impurity introduction is performed for the gate electrode.

In the step shown in FIG. 5D in manufacturing method 2, the photoresist layer 22 may be so formed as to cover the gate electrode 14A of the protection MOS transistor 5 or as not to cover it (state shown in FIG. 5D may be made as it is). If the gate electrode 14A of the protection MOS transistor 5 is not covered by the photoresist layer 22, additional impurity introduction is performed for the gate electrode 14A.

In the step shown in FIG. 5E in manufacturing method 2, the gate electrode 14A of the protection MOS transistor 5 is protected by the photoresist layer 23 similarly to the above-described manufacturing method 1. In this manufacturing method 2, in addition to this, the gate electrode 14B of the NMOS transistor may also be protected by the photoresist layer 23. However, it is also possible that the gate electrode 14B of the NMOS transistor is not protected by the photoresist layer 23 and additional impurity introduction is performed for the gate electrode 14B.

In the step shown in FIG. 5F in manufacturing method 2, the photoresist layer 24 may be so formed as to cover the gate electrode 14A of the protection MOS transistor 5 or as not to cover it (state shown in FIG. 5F may be made as it is). If the gate electrode 14A of the protection MOS transistor 5 is not covered by the photoresist layer 24, additional impurity introduction is performed for the gate electrode 14A.

As the impurities used in manufacturing methods 1 and 2 described thus far, e.g. phosphorus (P) or arsenic (As) can be used as the N-type impurity and e.g. boron (B), boron fluoride ($BF_2$), or indium (In) can be used as the P-type impurity.

As the gate insulating film 13, e.g. silicon oxide ($SiO_2$), silicon oxynitride (SiON), or a composite film of $SiO_2$ and SiON can be used. Alternatively, as the gate insulating film 13, e.g. a high dielectric constant (High-k) film that has a thickness of about 1 to 3 nm and is composed of e.g. hafnium oxide ($HfO_2$), hafnium aluminum oxide ($HfAlO_2$), hafnium silicon oxide (HfSiO), tantalum oxide ($Ta_2O_5$), aluminum oxide (Al$_2$O$_3$), or zirconium oxide (ZrO$_2$) may be used. Furthermore, it is also possible that the respective films are used as a multilayer film.

Furthermore, in FIGS. 5A to 5G, the work function of the gate electrode 14A of the protection MOS transistor 5 is adjusted by changing the conductivity type of the polycrystalline silicon. On the other hand, in recent years, techniques of using a metal layer and a metal compound layer as the gate electrode have been reported.

Examples of the material of the metal layer and the metal compound layer used as the gate electrode will include titanium nitride (TiN), titanium (Ti), titanium silicon (TiSi), nickel (Ni), nickel silicon (NiSi), hafnium (Hf), hafnium silicon (HfSi), tungsten (W), tungsten silicon (WSi), tantalum (Ta), tantalum silicon (TaSi), tantalum silicon nitride (TaSiN), cobalt (Co), cobalt silicon (CoSi), and a multilayer body of these films. These films have work functions different from each other. Furthermore, the work function can be changed also based on the film deposition method. That is, by variously using these metal layers and metal compound layers according to the purpose, the work function of the gate electrode can also be so adjusted that the threshold voltage of the protection MOS transistor 5 becomes higher than that of the NMOS transistor included in the internal circuit.

2. Second Embodiment

[Structure of Protection MOS Transistor]

Figure 7:
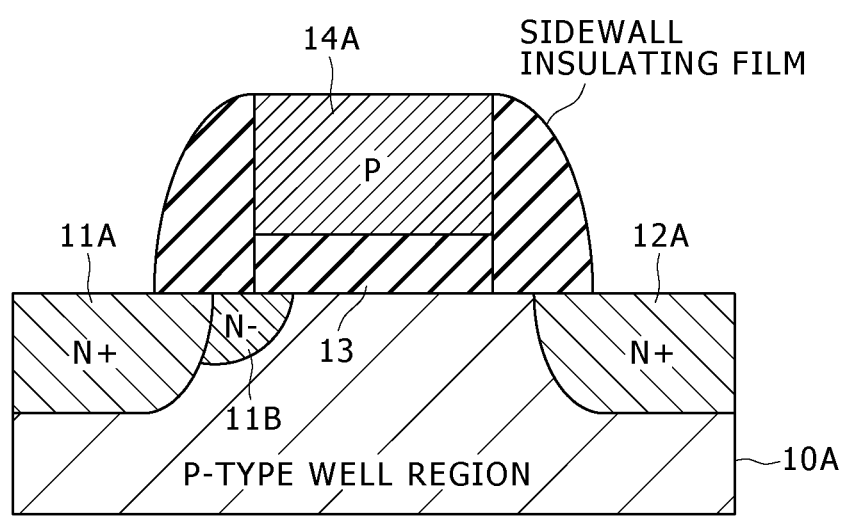
FIG. 7 is a sectional structure diagram of a protection MOS transistor relating to a second embodiment in the technique of the present disclosure.

FIG. 7 is a sectional structure diagram of a protection MOS transistor relating to a second embodiment in the technique of the present disclosure.

In the second embodiment, description of the same part as that in the first embodiment is omitted and only the different part will be described.

As shown in FIG. 7, the protection MOS transistor 5 of the second embodiment in the technique of the present disclosure has the gate electrode 14A formed of a P-type polycrystalline silicon layer as with the first embodiment.

However, it does not have the N$^-$ drain impurity region 12B although having the N$^-$ source impurity region 11B.

Such a protection MOS transistor 5 can be manufactured by the following method for example. Specifically, in forming the N$^-$ impurity regions by an ion implantation method in the step of FIG. 5C, the area that is originally to become the N$^-$ drain impurity region 12B through implantation of the N-type impurity is covered by the photoresist layer 21 as the "protective mask layer."

This change in the element structure can be achieved e.g. by change in the pattern of the photomask in forming the photoresist layer 21 with a pattern covering the forming area of the PMOS transistor. If the photomask after the pattern change is used, the pattern of the photoresist layer 21 is formed also on the drain side of the protection MOS transistor 5. If the N-type impurity is ion-implanted in the state in which the photoresist layer 21 having such a pattern is formed, in the protection MOS transistor 5, the N$^-$ drain impurity region 12B is not formed although the N$^-$ source impurity region 11B is formed.

Thereafter, the respective steps shown in FIG. 5D to FIG. 5G are carried out similarly to the first embodiment.

In the second embodiment, in the sectional structure of the protection MOS transistor 5 shown in FIG. 5C to FIG. 5G, the N$^-$ drain impurity region 12B does not exist. However, the other structure is the same as that shown in the diagram. Therefore, after the step shown in FIG. 5E, the channel forming region extended from immediately beneath the gate electrode 14A is directly connected to the N$^+$ drain impurity region 12A, which is so formed as to be offset from the gate electrode 14A by the sidewall insulating film 17 (FIG. 7).

In the protection MOS transistor 5 of the second embodiment in the technique of the present disclosure, the drain impurity region (N$^-$ drain impurity region 12B) is not disposed under the edge part of the gate electrode 14A. Therefore, the reverse-direction electric field applied to the PN junction between the silicon substrate under the gate electrode 14A and the drain impurity region is alleviated and the gate induced drain leakage (GIDL) current can be suppressed. As a result, the leakage current flowing through the protection MOS transistor 5 can be further reduced from the state in which the first embodiment in the technique of the present disclosure is applied.

3. Effects (Evaluation Results) of First and Second Embodiments

Figures 8, 9:
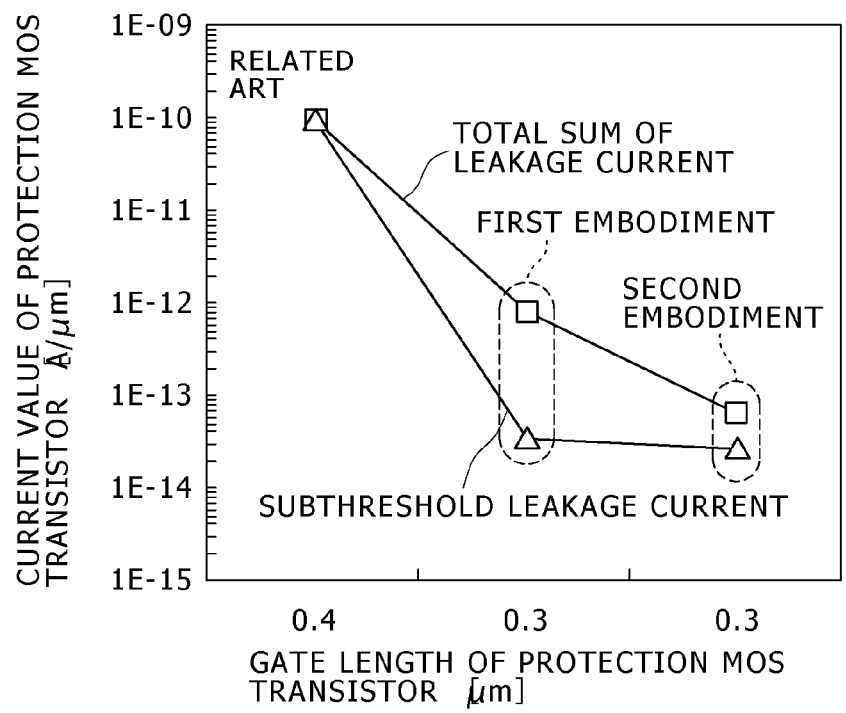
FIG. 8 is a diagram showing the result of measurement of the leakage current of the protection MOS transistor according to the first and second embodiments by a semiconductor parameter analyzer.
FIG. 9 is a table showing the leakage current of the protection MOS transistor according to the first and second embodiments and the clamp voltage measured by a TLP device.

FIG. 8 shows the result of measurement of the total sum of the leakage current flowing through the protection MOS transistor 5 according to the first and second embodiments and the subthreshold leakage current by a semiconductor parameter analyzer.

The protection MOS transistor to which the technique of the present disclosure is not applied has an N-type polycrystalline silicon electrode and the characteristic value thereof is represented as "related art" in FIG. 8. The characteristic values of the other square marks and triangle marks show the values when the technique of the present disclosure is applied. The protection MOS transistor 5 to which the technique of the present disclosure is applied has a P-type polycrystalline silicon electrode (gate electrode 14A).

As shown in FIG. 8, the gate length of the protection MOS transistor 5 having the P-type polycrystalline silicon electrode (gate electrode 14A) of the first embodiment is set smaller compared with the protection MOS transistor to which the technique of the present disclosure is not applied, which has the N-type polycrystalline silicon electrode. In addition, the subthreshold leakage current is reduced and thereby the total sum of the leakage current is greatly reduced.

Moreover, in the second embodiment, the GIDL current is reduced because the transistor does not have the drain impurity region under the edge part of the gate electrode 14A, and the total sum of the leakage current flowing through the protection MOS transistor 5 is further reduced from the first embodiment.

Before the technique of the present disclosure is applied, ensuring low on-resistance to lower the clamp voltage and reducing the leakage current cannot be balanced. Thus, the gate length is set to a comparatively large value of 0.4 µm.

In contrast, the technique of the present disclosure is applied and the threshold voltage of the protection MOS transistor is increased by enhancing the work function of the gate electrode in the protection MOS transistor. Therefore, the gate length is set to 0.3 µm, which is the same as the gate length of the MOS transistor of the same conductivity type (N-type) in the internal circuit. It turns out that the total sum of the leakage current can be sufficiently reduced even in this case.

A table of FIG. 9 shows the leakage current of the ESD protective circuit 1 including the protection MOS transistor 5 according to the first and second embodiments and the clamp voltage measured by a transmission line pulse (TLP) device.

Because of the reduction in the leakage current of the protection MOS transistor 5, the leakage current of the ESD protective circuit 1 is reduced. Furthermore, in the first embodiment and the second embodiment, the gate length of the protection MOS transistor 5 is smaller than that before the technique of the present disclosure is applied. As a result, the on-resistance of the protection MOS transistor 5 is reduced and the clamp voltage of the ESD protective circuit 1 is lowered.

In the second embodiment, the drain impurity region is not formed under the edge part of the gate electrode 14. Thus, the on-resistance of the protection MOS transistor 5 increases from that of the first embodiment and the clamp voltage is also higher than that of the first embodiment. However, the clamp voltage is lower than that before the technique of the present disclosure is applied.

Although explanation is made mainly about removal of a positive ESD surge in the above-described first and second embodiments, a high voltage pulse such as a negative ESD surge is also easily removed in the ESD protective circuit 1 shown in FIG. 1.

Because the protection MOS transistor 5 is an N-type transistor, a PN junction diode in which the $N^+$ drain impurity region 12A connected to the power supply line 2 serves as the cathode and the P-type well region 10A serves as the anode is formed. The P-type well region 10A is connected to the ground line 3 and kept at the reference potential (e.g. GND potential). Therefore, if the potential of the power supply line 2 decreases to a potential lower than the reference potential, this PN junction diode is forward biased to be turned on, whereby a high voltage pulse such as a negative ESD surge is immediately discharged from the power supply line 2.

In the explanation of the first and second embodiments, ESD protection in normal operation such as operation in which the supply voltage is applied or power activation is mainly explained.

However, in the ESD protective circuit 1 having the configuration shown in FIG. 1, the ESD protection effectively works also in assembly, in which the supply voltage VDD is not applied to the power supply terminal 2T and the power supply terminal 2T is in the floating state in terms of the potential. In the case of assembling a semiconductor chip as a package product, even when the power supply terminal 2T is in the floating state in terms of the potential, the ground terminal 3T is frequently earthed and connected to e.g. the GND potential. If positive ESD noise is generated in the power supply line 2 via e.g. the power supply terminal 2T in such a state, the CMOS inverter circuit 4 and the protection MOS transistor 5 instantaneously function by using this ESD noise as a positive power supply. Therefore, by operation similar to that already explained, the positive ESD noise is discharged to the ground line 3 via the protection MOS transistor 5 that is instantaneously turned on, so that the internal circuit 6 is protected.

Furthermore, negative ESD noise is discharged to the ground line 3 via the PN junction (diode) on the drain side of the protection MOS transistor 5 as with above.

4. Modification Example

Figure 10:
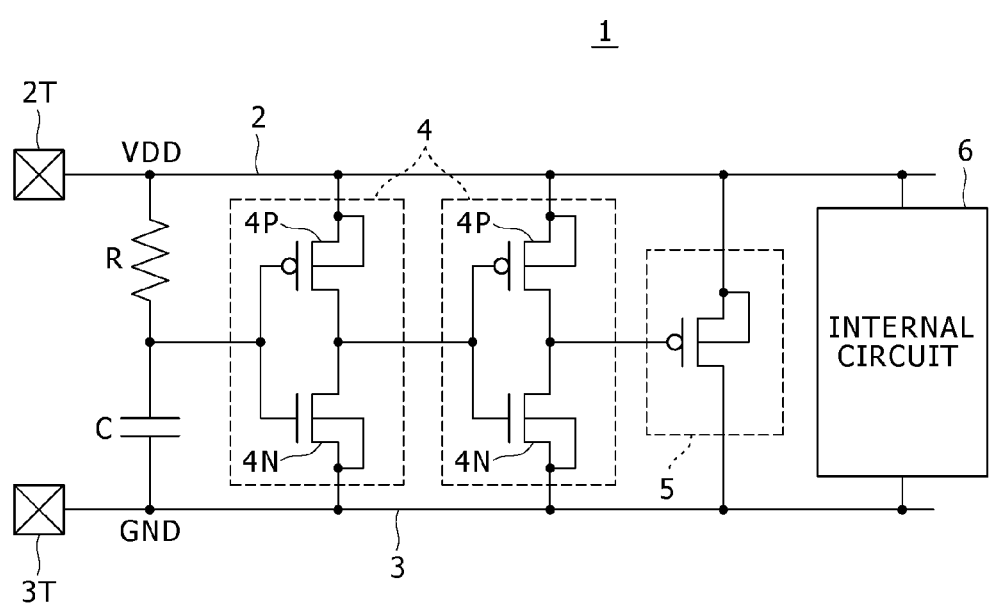
FIG. 10 is a circuit configuration diagram of an electrostatic protective circuit relating to a modification example.

In the circuit shown in FIG. 1, the channel conductivity type of the protection MOS transistor 5 may be set to the P-type as shown in FIG. 10. In this case, the number of inverter stages of the CMOS inverter circuit 4 is set to an even number.

Also in the configuration shown in FIG. 10, a high voltage pulse such as a negative ESD surge is also easily removed.

Because the protection MOS transistor 5 is a P-type transistor, a PN junction diode in which the N-type well region connected to the power supply line 2 serves as the cathode and the $P^+$ drain impurity region serves as the anode is formed. The $P^+$ drain impurity region is connected to the ground line 3 and kept at the reference potential (e.g. GND potential). Therefore, if the potential of the power supply line 2 decreases to a potential lower than the reference potential, this PN junction diode is forward biased to be turned on, whereby a high voltage pulse such as a negative ESD surge is immediately discharged from the power supply line 2.

As described above, both of the N-type and the P-type are possible as the channel conductivity type of the protection MOS transistor 5.

The manufacturing methods described for the first and second embodiments correspond to the case in which the channel conductivity type of the protection MOS transistor 5 is the N-type and thus the first conductivity type is the P-type and the second conductivity type is the N-type.

In contrast, if the channel conductivity type of the protection MOS transistor 5 is set to the P-type, the conductivity types of the impurities and the impurity regions should be inverted in the explanation of the above-described manufacturing methods. In this case, in FIGS. 5A to 5G, the gate electrode 14A of the protection MOS transistor 5 is set to the N-type although the channel conductivity type thereof is the P-type. Therefore, the gate electrode into which the same kind of N-type impurity as that for the gate electrode 14A of the protection MOS transistor 5 is simultaneously introduced is the gate electrode 14B of the NMOS transistor included in the internal circuit.

On condition that attention is paid to the above point, the manufacturing methods described for the first and second embodiments can be applied by analogy also to the case in which the channel conductivity type of the protection MOS transistor 5 is the P-type. In this case, the first conductivity type is the N-type and the second conductivity type is the P-type.

According to the above-described embodiments, the work function of the gate electrode of the protection MOS transistor is changed. As a result, the leakage current can be greatly reduced even when the gate length (gate electrode size in the direction of the flow of the channel current) is shortened.

Although the leakage current at the time of operation is reduced, the ESD protection performance, i.e. ESD noise removal performance, can be kept high at the time of operation and at the time of non-operation (including also assembly).

Furthermore, although a pull-down resistor and connection wiring thereof are not provided differently from the above-described Patent Document 1, the protection MOS transistor 5 shows less variation of the gate potential because it has a high threshold voltage. This reduces the leakage current generated due to variation of the gate potential of the protection MOS transistor attributed to potential variation of the power supply line due to power supply noise and so forth.

As for the leakage reduction, even the leakage component flowing in the substrate can be effectively reduced if the low-concentration impurity region on the drain side is omitted.

In the first and second embodiments, the change in the work function is realized mainly by changing the conductivity type of a semiconductor film (in the present example, polycrystalline silicon film). As another method, the film material itself such as a metal film of the gate electrode may be changed to another material.

The present application contains subject matter related to that disclosed in Japanese Priority Patent Application JP 2011-125639 filed in the Japan Patent Office on Jun. 3, 2011, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor integrated circuit comprising:
a protected circuit connected between two power supply lines that provide a supply voltage, the protected circuit including a first protected transistor with a channel region of a first conductivity type;
a detecting circuit including a resistive element and a capacitive element connected in series between the two power supply lines, the detecting circuit configured to detect a surge generated in one of the two power supply lines based on a potential variation at an inter-element connecting node;
an inverter coupled between the two power supply lines and parallel to the detecting circuit, an input of the inverter connected to the inter-element connecting node of the detecting circuit; and
a protection transistor connected between the two power supply lines, the protection transistor having (a) a control electrode connected to an output of the inverter and (b) a protection transistor channel region of the first conductivity type,
wherein,
the first protected transistor and the protection transistor are formed-in a same semiconductor substrate,
the first protected transistor channel region and the channel region of the protection transistor comprise surface regions of the same semiconductor substrate,
the control electrode of the protection transistor comprises an electrode material having a work function different from that of a control electrode of the first protected transistor,
the protection transistor has a drain region surface with two separated silicide portions,
a gate length of the control electrode of the protection transistor and a gate length of the control electrode of the first protected transistor are equal, the gate length of each of the control electrodes of the protection transistor and the first protected transistor being a size of a respective control electrode in a source/drain separation direction of a respective source region and the respective drain region, and
the protection transistor includes source and drain regions that are at opposite sides of the control electrode of the protection transistor, and the source region, and only the source region, has an LDD region that extends to beneath the control electrode of the protection transistor.

2. The semiconductor integrated circuit according to claim 1, wherein:
the protection transistor and the first protected transistor are in two different wells of the same conductivity type in the semiconductor substrate, and
the protected circuit includes a second protected transistor having a channel region in a well of a first conductivity type in the semiconductor substrate.

3. The semiconductor integrated circuit according to claim 2, wherein:
a control electrode of the second protected transistor and the control electrode of the protection transistor comprise semiconductor films having same thicknesses and into which an impurity of the second conductivity type is introduced at the same concentration into the respective semiconductor films, and
the control electrode of the first protected transistor comprises a semiconductor film having a same thickness as that of the control electrode of the protection transistor and that of the control electrode of the second protected transistor.

4. The semiconductor integrated circuit according to claim 3, wherein:
the wells of the protection transistor and the first protected transistor are of the second conductivity type,
the first conductivity type is a negative type,
the second conductivity type is a positive type, and
the semiconductor film is a polycrystalline silicon film.

5. The semiconductor integrated circuit according to claim 3, wherein:
the wells of the protection transistor and the first protected transistor are of the second conductivity type,
the first conductivity type is a positive type,
the second conductivity type is a negative type, and
the semiconductor film is a polycrystalline silicon film.

6. The semiconductor integrated circuit according to claim 1, includes:
a voltage applied to the drain region of the protection transistor is higher than a voltage applied to the source region of the protection transistor, and
a voltage applied to the drain region of the first protected transistor is higher than a voltage applied to the source region of the first protected transistor.

7. The semiconductor integrated circuit according to claim 1, wherein the control electrode of the protection transistor comprises a metal layer and a metal compound layer.

8. The semiconductor integrated circuit according to claim 1, wherein the control electrode of the protection transistor is of a second conductivity type opposite the first conductivity type.

9. A semiconductor integrated circuit comprising:
a protected circuit connected between two power supply lines that provide a supply voltage, the protected circuit including a first protected transistor having a first protected transistor channel region of a first conductivity type;
a detecting circuit including a resistive element and a capacitive element connected in series between the two power supply lines, the detecting circuit configured to detect a surge generated in one of the two power supply lines based on a potential variation at an inter-element connecting node;
a protection transistor connected between the two power supply lines, the protection transistor having (a) a control electrode, (b) a protection transistor channel region of the first conductivity type; and
an inverter comprised of two or more inverter stages coupled in series between the protection transistor and the inter-element connecting node, the inverter stages coupled in parallel between the two power supply lines, an input of a first inverter stage being connected to the inter-element connecting node, and an output of another inverter stage being connected to the control electrode of the protection transistor, wherein, the first protected transistor and the protection transistor are formed-in a same semiconductor substrate, the first protected transistor channel region and the channel region of the protection transistor comprise surface regions of the same semiconductor substrate, the control electrode of the protection transistor comprises an electrode material having a work function different from that of a control electrode of the first protected transistor, the protection transistor has a drain region surface with two separated silicide portions, the control electrode of the protection transistor is of a second conductivity type opposite the first conductivity type, a gate length of the control electrode of the protection transistor and a gate length of the control electrode of the first protected transistor are equal, the gate length of each of the control electrodes of the protection transistor and the first protected transistor being a size of a respective control electrode in a source/drain separation direction of a respective source region and the respective drain region, and the protection transistor source and drain regions that are at opposite sides of the control electrode of the protection transistor, and the source region, and only the source region, has an LDD region that extends to beneath the control electrode of the protection transistor.

10. A circuit comprising:

two power supply lines;

a protected circuit coupled between the two power supply lines, the protected circuit having a first protected transistor;

a detecting circuit coupled between the two power supply lines;

an inverter comprising one or more inverter stages, each inverter stage coupled between the two power supply lines and in parallel to the detecting circuit, an output of the detecting circuit coupled to an input of the inverter; and a MOS-type protection transistor coupled between the power supply lines, the protection transistor having a control electrode coupled to an output of the inverter, the control electrode being made of a polycrystalline film doped to be of a conductivity type opposite that of a channel region of the MOS-type protection transistor, wherein, the MOS-type protection transistor and the first protected transistor having channel regions of the same conductivity type but control electrodes of different conductivity types, a gate length of the control electrode of the MOS-type protection transistor and a gate length of a control electrode of the first protected transistor are equal, the gate length of each of the control electrodes of the protection transistor and the first protected transistor being a size of a respective control electrode in a source/drain separation direction of a respective source region and the respective drain region, the MOS-type protection transistor includes source and drain regions that are at opposite sides of the control electrode of the protection transistor, and the source region, and only the source region, has an LDD region that extends to beneath the control electrode of the protection transistor.

11. The circuit of claim 10, wherein the channel region of the MOS-type protection transistor is P-type and the inverter has an even number of the inverter stages.

12. The circuit of claim 10, wherein the channel region of the MOS-type protection transistor is N-type and the inverter has an odd number of inverter stages.

* * * * *